United States Patent
Wei et al.

(10) Patent No.: US 9,654,021 B2
(45) Date of Patent: May 16, 2017

(54) MULTIFUNCTION POWER CONVERTER WITH OPTION FOR INTEGRATED MAGNETICS

(71) Applicants: Lixiang Wei, Mequon, WI (US); Robert M. Michalski, West Bend, WI (US); Yogesh Patel, Grafton, WI (US); Bruce W. Weiss, Milwaukee, WI (US); Brian P. Brown, Mayville, WI (US)

(72) Inventors: Lixiang Wei, Mequon, WI (US); Robert M. Michalski, West Bend, WI (US); Yogesh Patel, Grafton, WI (US); Bruce W. Weiss, Milwaukee, WI (US); Brian P. Brown, Mayville, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 377 days.

(21) Appl. No.: 14/049,266

(22) Filed: Oct. 9, 2013

(65) Prior Publication Data

US 2015/0098257 A1 Apr. 9, 2015

(51) Int. Cl.
*H02M 5/45* (2006.01)
*H02M 5/458* (2006.01)
*H05K 7/14* (2006.01)

(52) U.S. Cl.
CPC ........ *H02M 5/4585* (2013.01); *H05K 7/1432* (2013.01)

(58) Field of Classification Search
CPC .... H02M 5/4585; H02M 5/458; H02M 5/447; H02M 5/45; H02M 5/4505; H02M 5/005; H02M 1/12; H02M 7/7575
USPC .............................. 363/34–37, 49, 125–132
See application file for complete search history.

(56) References Cited

U.S. PATENT DOCUMENTS

| | | | |
|---|---|---|---|
| 4,602,200 A | 7/1986 | Walker | |
| 5,623,191 A * | 4/1997 | Wieloch | H02M 7/003 318/801 |
| 2004/0263284 A1 | 12/2004 | Terakawa et al. | |
| 2005/0105306 A1 * | 5/2005 | Deng | H02M 5/4585 363/37 |
| 2006/0087278 A1 * | 4/2006 | Furem | H02M 1/12 318/778 |

(Continued)

FOREIGN PATENT DOCUMENTS

CN 202856646 U 4/2013

OTHER PUBLICATIONS

Extended European Search Report of European Application No. 14188255.5-1905 dated Oct. 10, 2016.

(Continued)

*Primary Examiner* — Jue Zhang
*Assistant Examiner* — Kevin H Sprenger
(74) *Attorney, Agent, or Firm* — Fay Sharpe LLP

(57) ABSTRACT

Power converter modules and parallel conversion systems are presented in which the modules are provided in a rollable enclosure having AC and DC electrical connections, and an interior including a switching circuit with switching devices individually connected between a corresponding AC node and a corresponding DC node for operation as either a rectifier or an inverter and an internal filter circuit with inductors individually connected between a corresponding AC node of the switching circuit and a corresponding AC electrical connection, with a built-in blower or fan to cool the filter circuit during operation.

20 Claims, 16 Drawing Sheets

(56) References Cited

U.S. PATENT DOCUMENTS

| | | |
|---|---|---|
| 2007/0058400 A1 | 3/2007 | Kimura et al. |
| 2007/0212910 A1 | 9/2007 | Tracy et al. |
| 2008/0049468 A1 | 2/2008 | Wei et al. |
| 2008/0150462 A1* | 6/2008 | Miettinen ............. H02M 5/458 318/471 |
| 2009/0058350 A1 | 3/2009 | Wei et al. |
| 2009/0276165 A1 | 11/2009 | Weiss et al. |
| 2010/0078998 A1 | 4/2010 | Wei et al. |
| 2010/0079230 A1 | 4/2010 | Wei et al. |
| 2010/0080024 A1 | 4/2010 | Wei et al. |
| 2010/0327799 A1* | 12/2010 | Broussard ............. H02M 7/003 318/807 |
| 2010/0328883 A1* | 12/2010 | Ledezma ............. H02M 7/003 361/690 |
| 2011/0101897 A1 | 5/2011 | Wei et al. |
| 2011/0103096 A1 | 5/2011 | Wei et al. |
| 2011/0103105 A1 | 5/2011 | Wei et al. |
| 2011/0153234 A1 | 6/2011 | Winterhalter et al. |
| 2011/0286244 A1 | 11/2011 | Wei et al. |
| 2011/0295437 A1 | 12/2011 | Lu et al. |
| 2011/0309875 A1 | 12/2011 | Wei et al. |
| 2012/0014042 A1 | 1/2012 | Tallam et al. |
| 2012/0262969 A1 | 10/2012 | Nagano et al. |
| 2013/0093376 A1* | 4/2013 | Yoo ....................... H02M 1/126 318/503 |
| 2013/0106328 A1 | 5/2013 | Kopiness et al. |
| 2013/0241451 A1 | 9/2013 | Wei et al. |
| 2013/0242623 A1 | 9/2013 | Wei et al. |
| 2013/0342138 A1* | 12/2013 | Permuy .................. H02M 5/42 318/400.3 |

OTHER PUBLICATIONS

Chinese Office Action of corresponding Chinese Patent Application No. 201410524981.X.

* cited by examiner

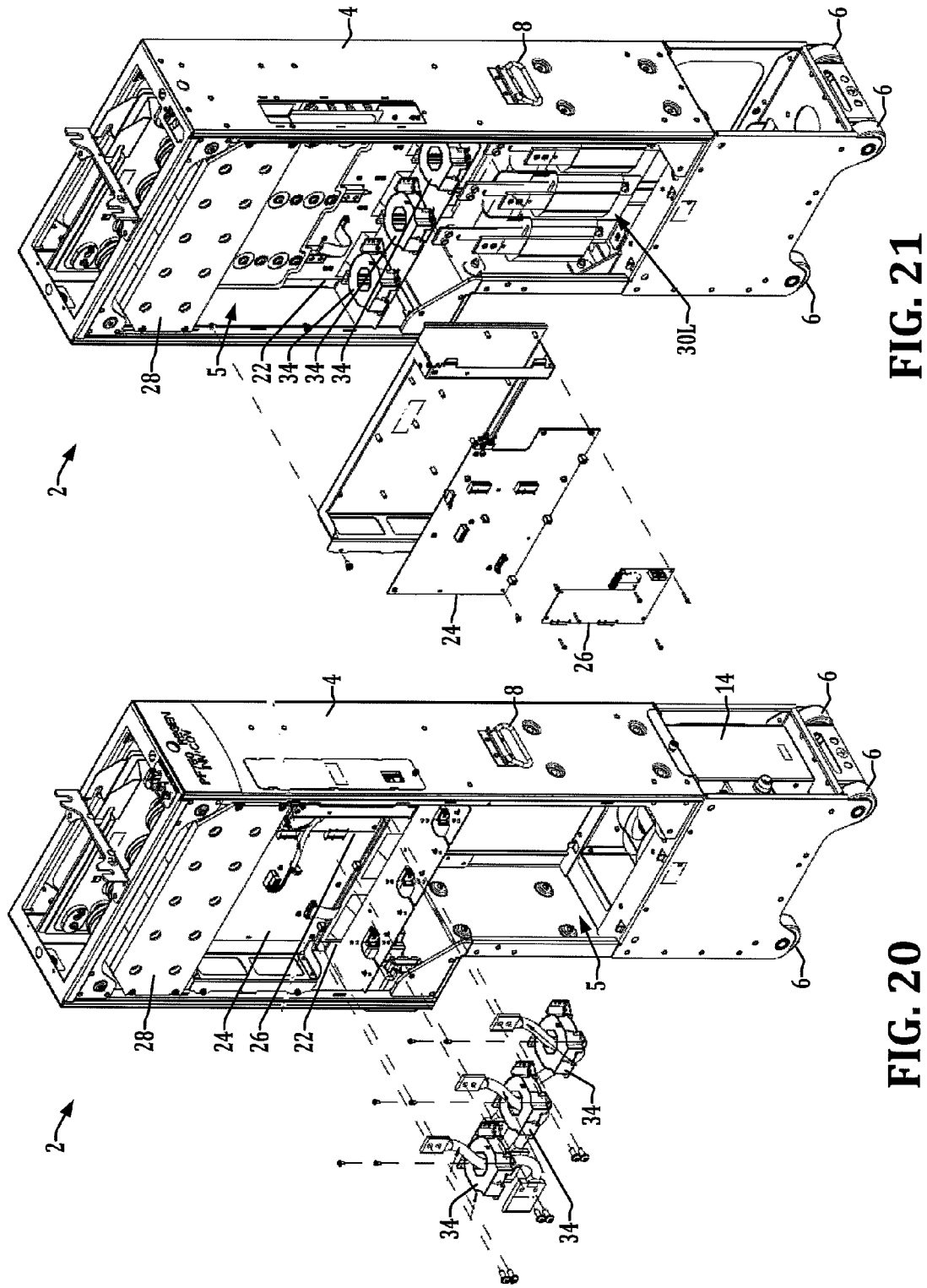

MULTIFUNCTION POWER CONVERTER WITH OPTION FOR INTEGRATED MAGNETICS

BACKGROUND

Power conversion systems convert input electrical power from one form to another for driving a load. Motor drive type power converters are used in a variety of applications to provide electrical power to drive a motor load. For instance, motor drives may be needed to power low voltage as well as high-voltage motors, and multiple motor drives may be connected in parallel to accommodate higher load requirements. In a typical situation, AC input power is initially converted by an active or passive rectifier circuit to provide a DC bus voltage for use by one or more output inverters to create variable frequency, variable amplitude AC output power to drive an induction motor load. For the initial rectification of AC input power, active front-end rectifiers (AFE) can be used, including actively controlled switching devices to create and maintain a regulated DC bus voltage, and may implement various additional functions such as power factor correction (PFC). In other cases, passive or fundamental-frequency front-end (FFE) rectifiers may be used, and input filters are often connected between the AC power source and the passive rectifier input. With respect to the output inverter(s), internal inverter switching devices selectively connect the DC input power lines to specific AC motor lines to create the output waveforms necessary to drive the motor to a desired speed, position, torque, etc., and output filter circuits may be connected between the inverter output and the driven motor for motor protection. In addition, parallel inverter configurations may include paralleling inductors connected between the outputs of two or more parallel-connected inverters. In general, the variability in the requirements of a given motor drive application often require custom designing and configuration of system components and their interconnections including the necessary power converters and filter components which are then connected together to form a power conversion system. In order to accommodate a wide variety of power conversion system specifications while minimizing system cost, it is therefore desirable to provide modular components that can be used in building two or more different types and forms of systems.

SUMMARY

One or more aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter. The present disclosure provides power conversion systems and apparatus in which a power converter module includes switching circuitry and integrated magnetics or filter circuits to facilitate construction of a wide variety of application-specific power conversion systems, while facilitating ease of manufacturing using common components and controlling costs. Moreover, the illustrated power conversion module apparatus may include integral cooling fans or blowers to facilitate cooling of filter inductors to further reduce the cost, complexity, and space of the end power conversion system.

In accordance with one or more aspects of the present disclosure, a power conversion apparatus is provided which includes an enclosure with AC and DC electrical connections, where the enclosure provides an interior in which a switching circuit and a filter circuit are located with the filter circuit at a lower level than the switching circuit. In certain implementations, the filter circuitry includes a plurality of inductors connected between the switching circuit and a corresponding AC connection, thereby facilitating use as output filters if the apparatus is used as a switching inverter, or as input filter inductors for active or passive rectifier usage. The apparatus can thus be easily adapted for use as a front-end rectifier, active or passive, or as an output inverter, with on-board filter circuitry being easily configured for a variety of applications and functions including motor protection, inverter paralleling, fundamental front end (FFE) and/or active front-end (AFE) operation as needed. In addition, exemplary embodiments may optionally provide a compact modular design with integral rollers or wheels that can be easily rolled into position in a control panel or other installation for interconnection with other system components to provide a motor drive or other form of power conversion system.

In certain embodiments, the filter circuit can accommodate filter resistors for connection in parallel with a corresponding one of the filter inductors, thereby facilitating provision of L-R output filters to protect the motor for inverter applications. The apparatus may also include a blower fan assembly below the filter circuit within the enclosure interior for cooling the filter circuit and possibly other components during operation, thereby further facilitating compact system design without the need for external filter inductors and associated cooling fans. Other embodiments may also include an integral DC bus capacitor circuit providing a bank of capacitor components for stable DC bus voltage operation whether the apparatus is configured for use as a rectifier or as an inverter. Certain implementations also accommodate inclusion of two or more balance resistors for connection across the DC bus, which can also be used in inverter or rectifier configurations. The switching circuit, moreover, may include switches such as IGBTs and/or diodes, thereby facilitating use as active front end (AFE) or fundamental front-end (FFE) rectifiers.

A power conversion system is provided in accordance with further aspects of the disclosure, including two or more power converter modules individually configured as active front end switching rectifiers and including an enclosure, AC and DC connections, a switching circuit, an integral filter circuit connected between the switching circuit and the AC connections, as well as a control board, all located within the interior of the enclosure, where the AC outputs of the converter modules are connected together for parallel operation to drive a single load, such as a motor.

In accordance with further aspects of the disclosure, a power conversion system is provided which includes first and second power converter modules configured as passive rectifiers, each including an enclosure with an AC input, a DC output, a rectifier circuit, and a filter circuit with a plurality of inductors connected between the rectifier circuit and the AC input, where the AC inputs and DC outputs of the power converter modules are connected to one another in parallel.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which:

FIG. 20 is a perspective view showing installation of current transducers with no filter circuit inductors in the interior of the power converter module enclosure;

FIG. 21 is a perspective view illustrating installation of a power interface board (PIB) and a power layer interface board (PLIB) in the interior of the power converter module enclosure;

DETAILED DESCRIPTION

Figure 3:
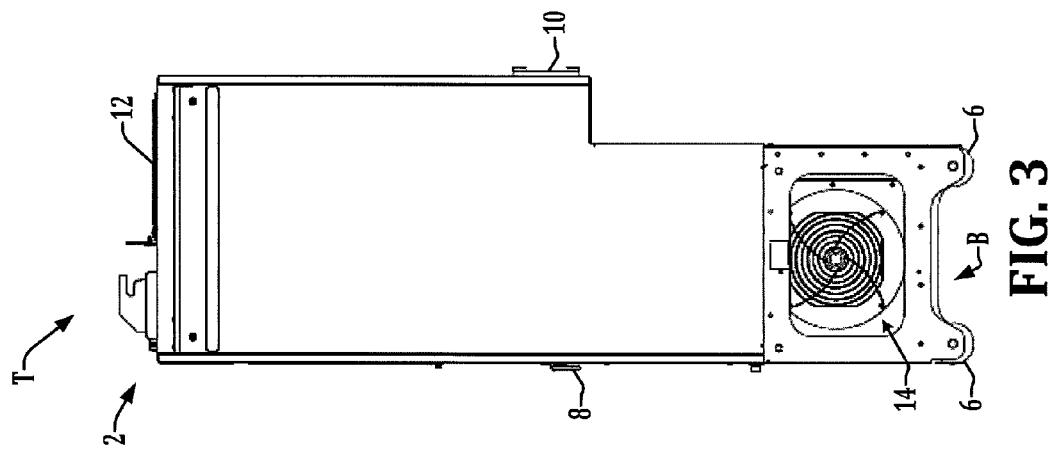
FIGS. 1-3 are perspective, front elevation, and side elevation views illustrating an exemplary power converter module having integrated magnetics and switching circuitry for operation as either a rectifier or an inverter in accordance with one or more aspects of the present disclosure.
Figure 2:
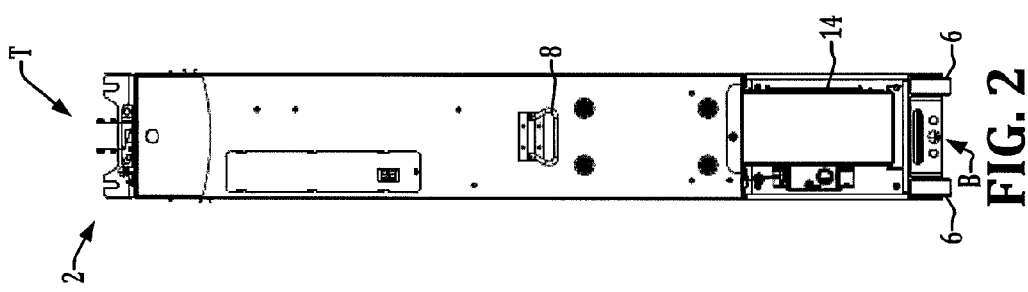

Referring now to the figures, several embodiments or implementations are hereinafter described in conjunction with the drawings, wherein like reference numerals are used to refer to like elements throughout, and wherein the various features are not necessarily drawn to scale. Various embodiments below describe universal architectures providing modular power converter apparatus that can be configured and interconnected to accomplish multiple functions, including without limitation standalone inverter systems, parallel inverter systems, motor drives providing integral motor protection, active front-end rectifiers and fundamental front-end rectifier applications, with integral input filters. Thus far, attempts at modular power converter architectures have been limited to providing only one of a small number of functionalities, such as paralleling and standalone inverters, and separate filter circuitry and associated cooling apparatus has been required to ensure motor protection and adequate filtering for active rectifier applications. The present disclosure, on the other hand, provides a compact cost effective apparatus that can be used in a wide variety of motor drive or other power conversion applications, thereby facilitating optimal usage of the area available in a given application while controlling cost by integration of all the necessary components within a single enclosure for shared protection and cooling. Moreover, the modular design of the various embodiments facilitates reconfiguration of a given module by use of identical or similar bus work for multiple types of power converters, including usage in regenerative as well as non-regenerative drive systems.

Figure 10:
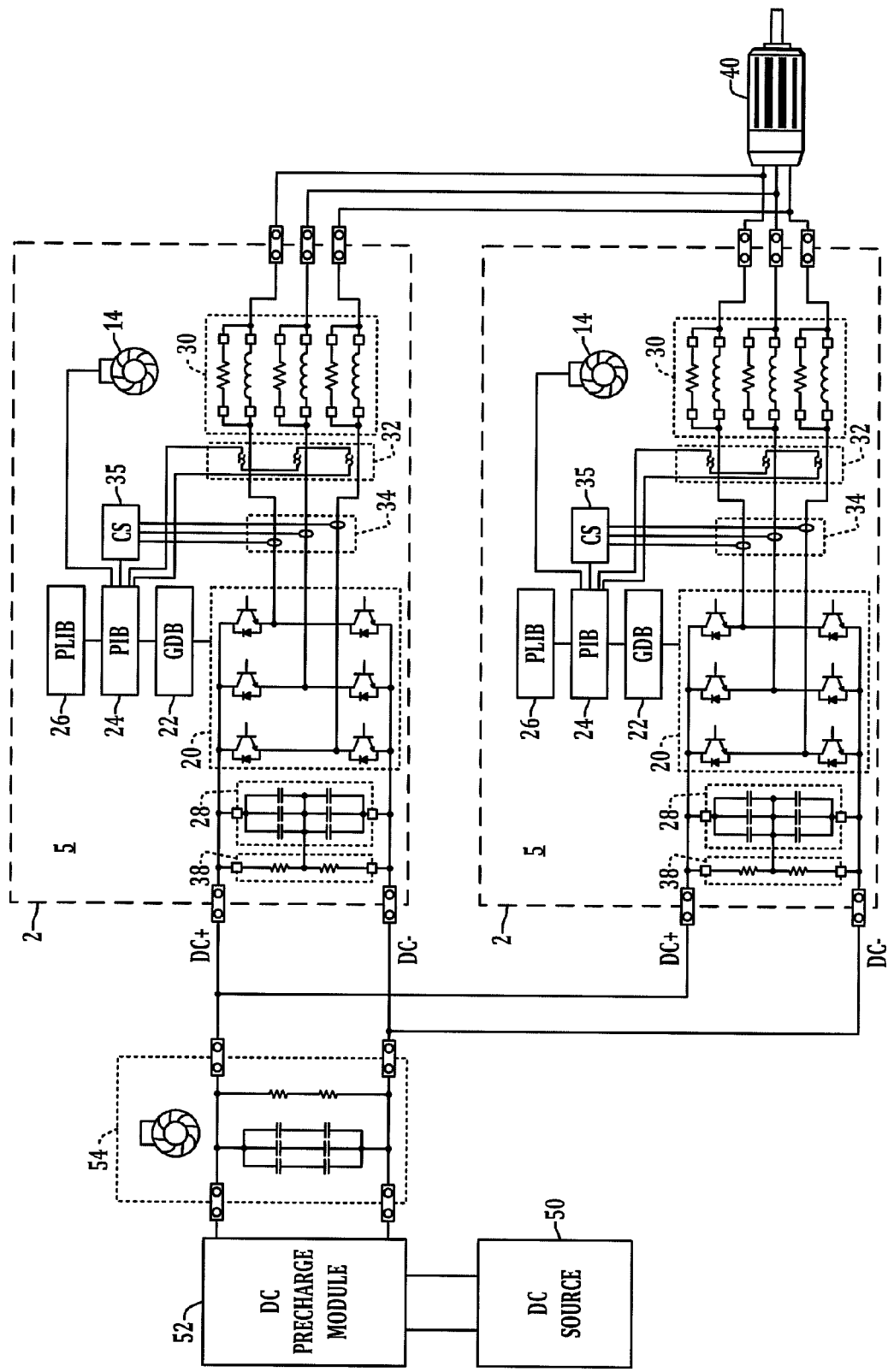
FIG. 10 is a schematic diagram illustrating an exemplary parallel inverter motor drive system with two power converter modules operating as inverters with integral L-R output filters to drive a single motor load.

Referring initially to FIGS. 1-4, FIGS. 1-3 respectively illustrate perspective, front and side views of an assembled power converter apparatus 2, sometimes referred to herein as a power converter module 2, having an enclosure 4 with a top T, a front side F and a bottom B which is supported by roller wheels 6. The front side F in this embodiment includes a handle 8 allowing easy positioning of the power converter module 2 in an industrial facility and/or within a control cabinet (not shown). As seen in FIG. 10, moreover, a backside of the enclosure 4 provides a stab type power connector interface 10 for interconnecting the module 2 with AC and DC power connections for use as either an inverter or a rectifier for a given application. The enclosure in this case includes a number of removable side panels to allow ease of manufacturing and maintenance, and defines an interior 5 in which one or more power conversion system components are mounted. In addition, the illustrated module 2 includes a blower fan assembly 14 positioned in the lower portion of the enclosure interior 5 to provide forced airflow in an upward direction which can be vented out of the top side T of the enclosure 4 via event opening 12. This advantageously provides cooling for filter circuit components as well as switching circuit devices (e.g., IGBTs) and other components of the module 2.

Figure 4:
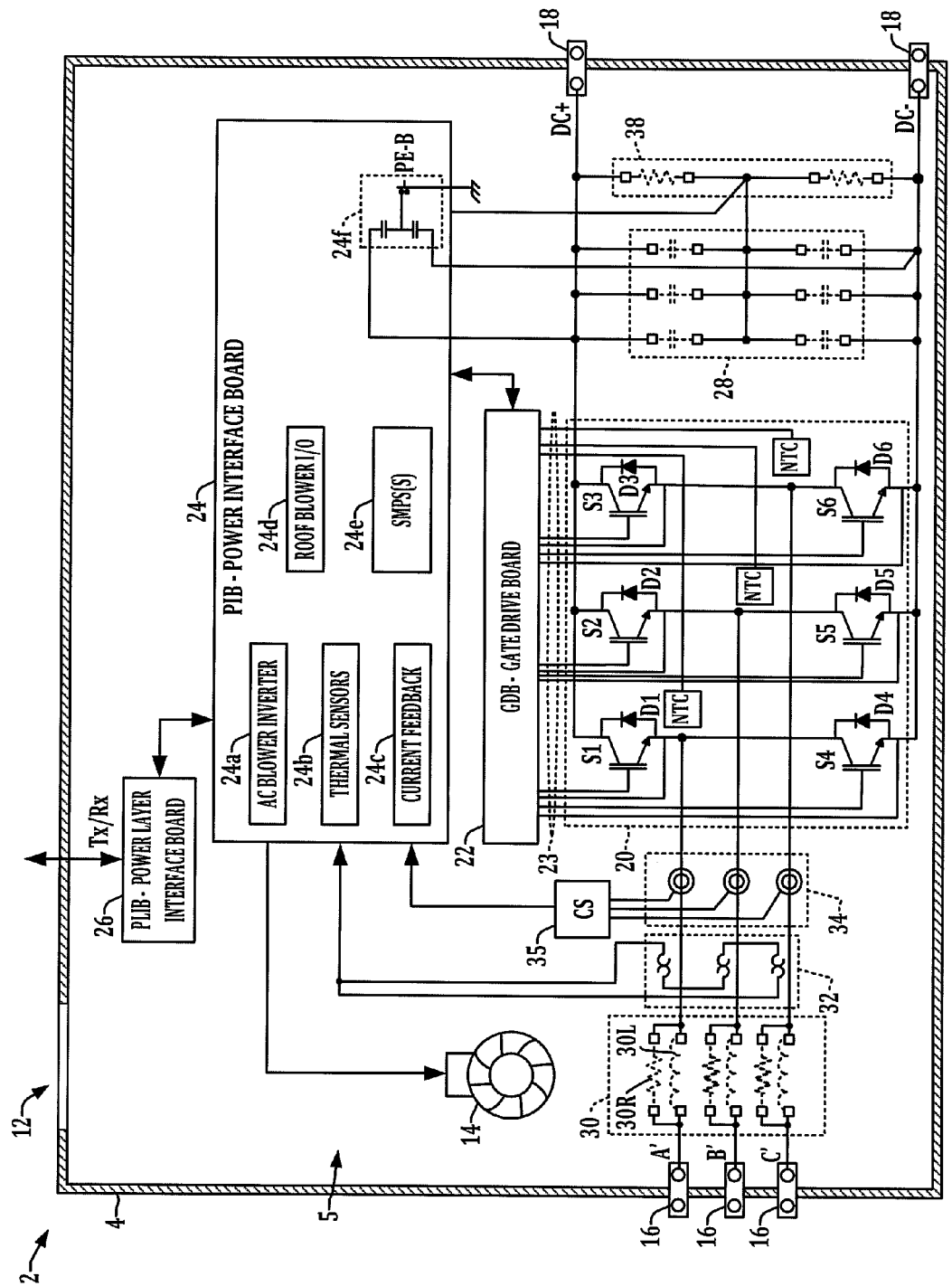
FIG. 4 is a partial schematic diagram illustrating further details of the exemplary power converter module of FIGS. 1-3.

FIG. 4 shows a partial schematic rendering of the power converter module 2, in which a variety of components and subassemblies are positioned within the enclosure interior 5. As seen in FIG. 4, the module 2 includes three AC connections 16, such as busbars or other electrical connections by which external AC cabling can be connected to the module 2. Although illustrated and described in the context of a three-phase AC connection 16 for phases A', B' and C', other single or multiphase AC connections are possible, which may include more than three connections 16. In addition, first and second (positive DC+ and negative DC−) DC connections 18 are provided, by which external DC power cabling can be connected to the module 2. As the module 2 can be configured to operate as a rectifier or as an inverter, the AC and DC connections 16 and 18 can alternatively be considered as inputs or outputs depending on the end application. A switching circuit 20 is located within the interior 5 of the enclosure 4, and includes switching devices S1-S6 for selective conversion of AC input power to provide DC output power for active (switching) rectifier applications or alternatively for converting input DC power to provide AC output power for inverter applications. In this case, six switches S1-S6 are provided to convert between DC power and three-phase AC power, although any suitable number of switching devices can be used for other single or multiphase implementations. In addition, although illustrated as using IGBT type switches S1-S6, any suitable switching devices may be used, including without limitation silicon controlled rectifiers (SCRs), gate turn-off thyristors (GTOs), integrated gate commutated thyristors (IGCTs), etc. Moreover, the switching circuit 20 in certain embodiments also includes diodes D1-D6 configured as shown in FIG. 4, to facilitate active switching operation as well is to provide the capability for passive fundamental front-end (FFT) rectifier operation if desired, in which case the circuit 20 can be considered a rectifier circuit events the switching devices S1-S6 are not actively operated or are omitted. Moreover, the thermal condition of the AC internal nodes of the switching circuit 20 may be monitored for control purposes using one or more sensors, such as negative temperature coefficient components NTC as seen in FIG. 4.

Gate switching control signals 23 are provided to operate the IGBTs S1-S6, which may be generated using any suitable controller and driver circuitry. As seen in the example of FIG. 4, the signals 23 are provided in one possible embodiment by a gate drive board (GDB) 22 which includes suitable driver and isolation circuitry providing output signals 23 to the gates of the IGBTs S1-S6 suitable for selective switching operation thereof, based on signaling received directly or indirectly from one or more processors to facilitate pulse width modulated switching control of the circuit 20 to achieve DC-AC or AC-DC conversion according to any suitable pulse width modulation switching control technique. The gate drive board 22 is operatively connected to a power interface board (PIB) 24, in this case implementing inverter power circuitry 24a for powering and otherwise controlling operation of the blower fan assembly 14, interface circuitry 24b for thermal sensors associated with the AC lines, current feedback interface circuitry 24c for interfacing with current sensors as discussed further below, as well as I/O circuitry 24d for interfacing with the blower 14, one or more switch mode power supplies (SMPs) 24e for generating and regulating internally used power levels, as well as a grounding circuit 24f for establishing a ground connection between a center point of the DC bus voltage and a chassis connection of the enclosure 4. In addition, the power interface board 24 is operatively connected to a power layer interface board (PLIB) 26 which implements a communications interface for communicating (TX/RX) with one or more external devices, such as an external controller or network (not shown).

Figure 23:
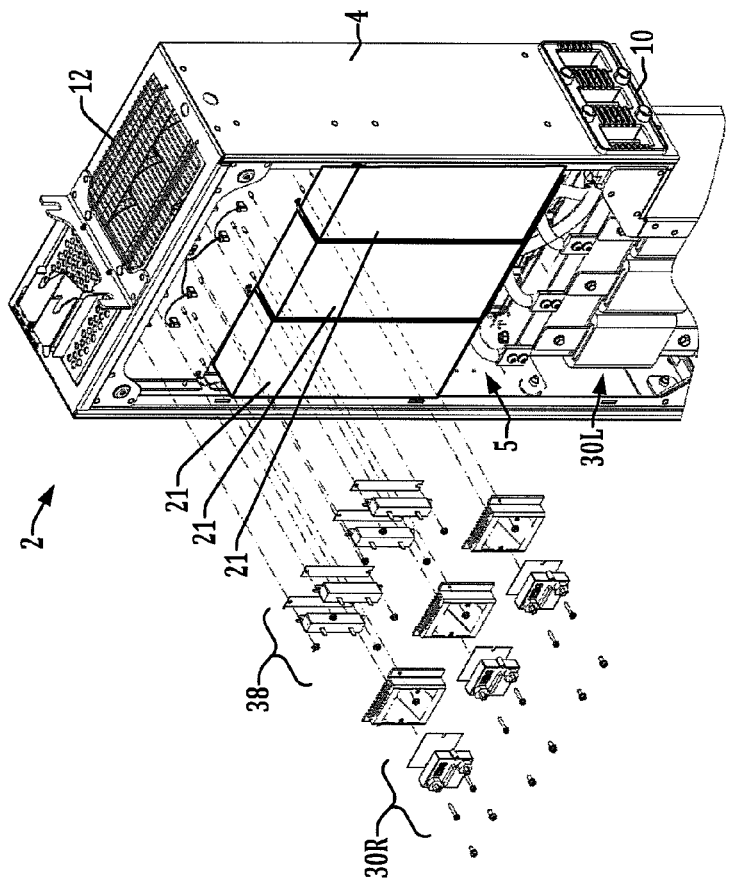
FIG. 23 is a partial perspective view showing installation of optional balance resistors and filter circuit resistors in the interior of the converter module enclosure.

As further shown in FIG. 4, moreover, a DC capacitance circuit or capacitor bank 28 may optionally be connected between the DC bus lines DC+ and DC− (e.g., see also FIG. 18 below), and the interior 5 of the enclosure 4 also facilitates optional inclusion of a pair of balancing resistors 38 as further illustrated and described below in connection with FIG. 23. While the capacitor bank 28 is illustrated as including six capacitors, any number of capacitors can be provided. On the AC side of the switching circuit 20, a filter circuit 30 is provided with suitable interconnection and mounting features for selective direct connection of the AC electrical connections 16 with the AC nodes of the switching circuit 20, or for connection of inductors 30L and/or filter resistors 30R between the AC connections 16 and the switching circuit 20. Moreover, as seen in FIG. 4, thermal sensor circuitry 32 may be located proximate the filter circuit 30 in order to monitor the operating conditions thereof, with signal connections to the power interface board 24.

As further shown in FIGS. 14-23 below, the filter circuit 30 is advantageously positioned below the switching circuit 20 within the enclosure 4, and is preferably disposed above the fan blower system 14, thereby advantageously facilitating cooling by the fan blower system 14. In addition, the location of the filter circuit 30 and the inductors 30L thereof beneath the level of the switching circuit 20 advantageously minimizes or reduces the length of cables used to connect the filter circuit components 30 between the external connectors 10 and the switching circuit 20. Consequently, less enclosure space is occupied by such power cables, and the interconnections are shorter than other possible approaches. For example, alternate configurations in which the filter inductors 30L would be disposed above the switching circuit would require excessive cables and bus bar structures running from the upper end of the enclosure interior 5 down to the external connections 10. In addition, the illustrated positioning of the filter circuit 30 above the fan blower assembly 14 and the switching circuit 20 provides more internal space to accommodate larger inductors 30L than would be possible if the filter components 30 were located above the switching circuit 20. In addition, although illustrated below as including solid core inductors 30L, air core (e.g., coreless) filter inductors 30L may be used in various embodiments.

Moreover, closed loop control for inverter AC output currents and/or AC input current monitoring for active front-end rectifier power factor correction may be facilitated by the provision of current transducers or sensors 34, which provide signals to the power interface board 24 via a current sensor (CS) module 35. Switching control operation may be directed in the module 2 by one or more programmed processors located on one or more of the boards 22, 24, 26 to implement various power conversion and/or motor control functions as are known. Moreover, in certain embodiments, the control processor components of the module 2 may receive one or more setpoints or desired operating conditions as signals and/or values from an external control component, such as a hierarchical distributed control element and/or external network (not shown).

Referring now to FIGS. 5-13, several non-limiting configurations and interconnections are presented, illustrating the easy adaptability of the integrated power converter apparatus 2 to a variety of power conversion system applications and end uses.

Figure 5:
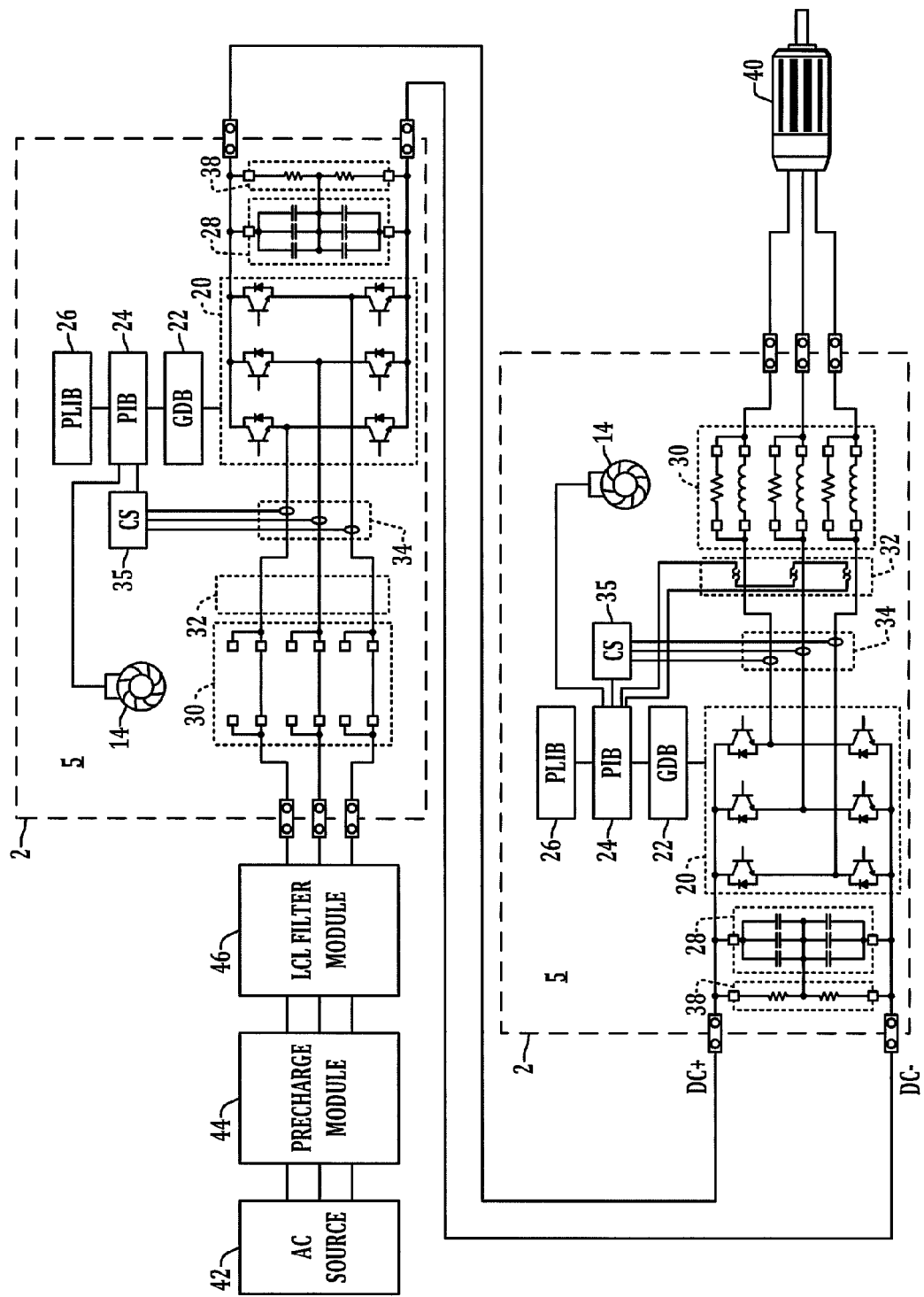
FIG. 5 is a schematic diagram illustrating a voltage source converter motor drive system implemented using a first power converter module configured as an active front end (AFE) rectifier and a second power converter module operated as an inverter with an integrated output filter circuit.

FIG. 5 illustrates a complete voltage source converter regenerative motor drive system implemented using two of the converter modules 2. A first module 2 (upper right in the figure) is configured as an active front end (AFE) rectifier to convert received AC input power to provide a controlled voltage at a DC bus connected to the second module 2. In the second module 2 (lower part of the figure), DC input power is inverted by the switching circuit 20 to provide controlled AC output power to drive a motor load 40. In the implementation of FIG. 5, moreover, an AC power source 42 (three phase in this example) is connected to the AC terminals of the first power converter module 2 through an optional precharge module 44 and an LCL filter module 46, one or both of which may be omitted in alternate implementations. In operation, the precharge module 44 can advantageously introduce resistive impedance in the AC lines for a controlled time upon system startup to control or limit inrush current experience by the DC bus capacitance of the capacitor circuit 28 in the rectifier module 2 as well as that of the capacitors 28 in the subsequent inverter module 2.

In the illustrated embodiment, moreover, the rectifier module 2 is configured with shorting cables within the filter circuit 30 in order to directly electrically connect the AC input connections to the AC nodes of the switching circuit 20, wherein the input filtering is provided by the external LCL filter module 46. The use of an LCL filter 46 in conjunction with the active front-end operation of the rectifier module 2 advantageously facilitates control of total harmonic distortion (THD) at the power grid lines, and the active front end switching operation of the rectifier 2 can perform various power conditioning functions including without limitation power factor correction, and/or power regeneration functionality. In the inverter (the lower module) 2, the filter circuit 30 includes both filter inductors 30L and parallel-connected filter resistors 30R for motor protection, with the switching circuit 20 being pulse width modulated to provide controlled AC output power to drive the motor 40. In this system, moreover, an optional snubber circuit (not shown) may be connected across the DC bus lines DC+, DC− external to the enclosures of the power converter modules 2. In this embodiment, as in others illustrated and described herein, the power converter modules 2 as well as the other modules 44, 46 may be commonly housed in a single control cabinet in certain implementations, with suitable environmental controls and interconnections to provide an overall motor drive system in a relatively compact form.

Figure 6:
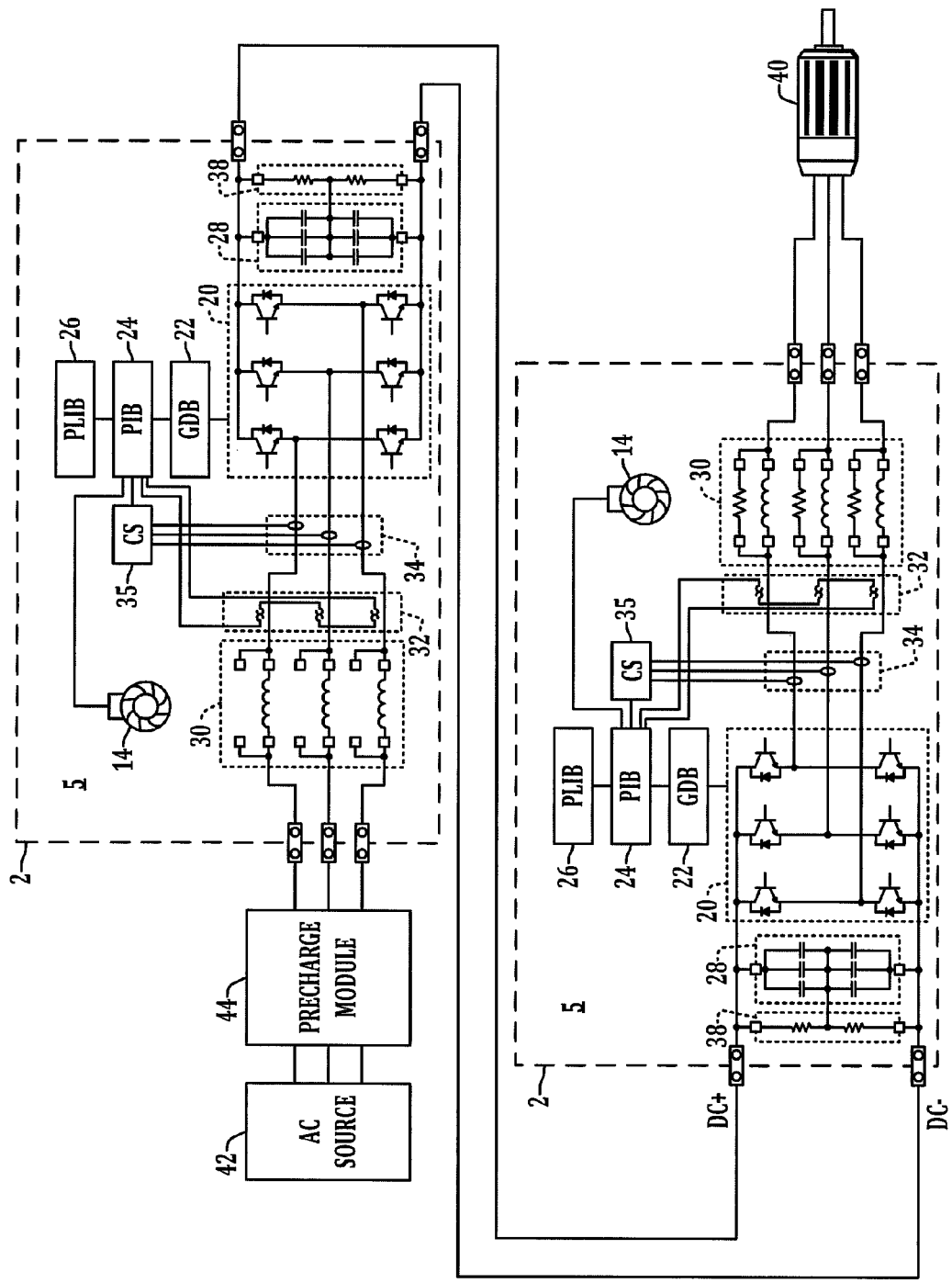
FIG. 6 is a schematic diagram illustrating another voltage source converter motor drive system including a first power converter module configured as a fundamental front end (FFE) rectifier with an AC input filter including integrated inductors, as well as a second power converter module configured as an inverter with an integrated output filter circuit.

FIG. 6 shows another voltage source converter motor drive system with a first power converter module 2 providing fundamental front end (FFE) rectification of AC input power received from the source 42 through a pre-charge module 44, in which the filter circuit 30 of the rectifier module 2 has filter inductors installed between the AC connections and the AC nodes of the switching circuit 20. In this case, moreover, the diodes D1-D6 of the switching circuit operate to provide passive rectification of the received AC input power to provide a DC output across the bus lines DC+, DC−. The incorporation of the integrated magnetics of the internal filter circuit 30 in the rectifier module 2 in this example advantageously allows elimination of the external filter module 46 used in the above example of FIG. 5. Moreover, the provision of the blower fan assembly 14 in the interior 5 of the module 2 advantageously provides cooling for the filter inductors 30L, whereby the cost and space associated with external filter cooling apparatus is also saved by the combination of integrated magnetics and internal cooling provided by the modular design 2.

Figure 7:
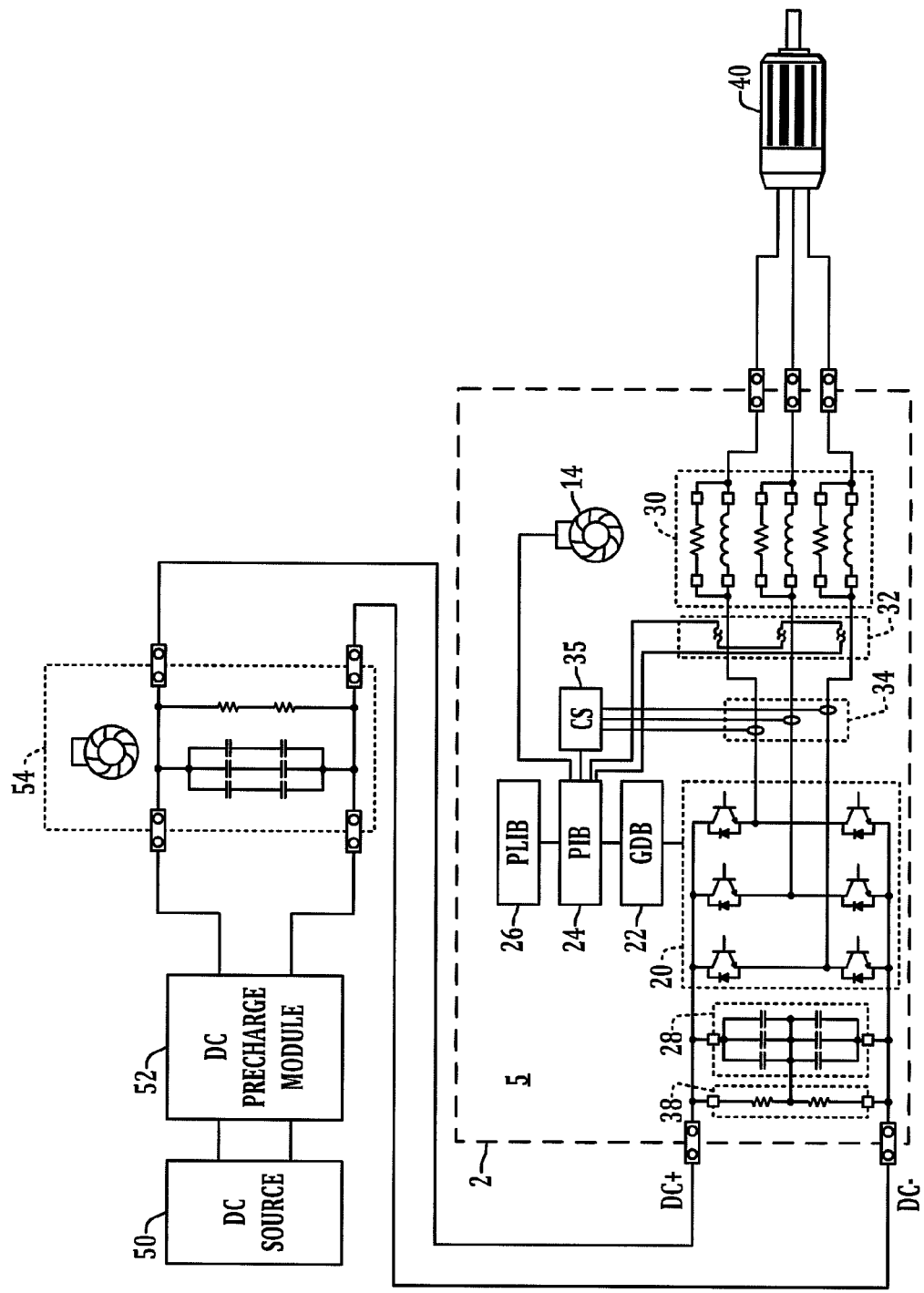
FIG. 7 is a schematic diagram illustrating another power conversion system using a power converter module with an optional L-R filter circuit as shown in FIGS. 1-4 operating as a switching inverter to convert input power from a DC power source to provide AC output power to a motor load.

FIG. 7 illustrates an inverter configuration of a module 2 which can be advantageously employed in common DC bus configurations wherein two or more inverters 2 obtain DC input power from a single DC source 50. An optional DC precharge module 52 may be included between the DC source 50 and the DC connections of the module 2, for example, to provide selective connection of resistive elements for mitigating excessive inrush currents on startup. In this example, moreover, an optional additional DC bus capacitance circuit 54 can be included between the precharge module 52 and the power converter module 2, which may include a capacitor bank as shown connected between the positive and negative DC bus lines DC+, DC−, and may further include balancing resistors as shown and/or a dedicated cooling fan. In certain implementations, moreover, the DC bus capacitance circuitry 54 may be implemented by suitable configuration and connection of a power converter module 2 as shown in FIGS. 1-4 above, which can be configured for this purpose.

In this implementation, moreover, the inverter module 2 is configured to include an internal DC bus capacitor bank 28 as well as a pair of balancing resistors 38 as shown, although other implementations are possible in which these items are omitted, with the DC bus capacitance being provided by the external circuit 54. In other possible alternate implementations, moreover, the external DC bus capacitance circuit 54 can be omitted, with the DC bus capacitance being provided by the integrated capacitor bank 28 of the module 2. In addition, the exemplary system of FIG. 7 also advantageously provides an output L-R filter circuit 30 equipped with filter inductors 30L and filter resistors 30R connected in parallel with one another in each of the AC output lines as shown for protection of the motor 40. Other implementations are possible in which the filter circuit 30 is equipped with only the inductors 30L and/or in which shorting cables or bars are installed in the filter circuit 30 to directly electrically connect the AC output connections with the AC nodes of the switching circuit 20 in the module 2.

Figure 8:
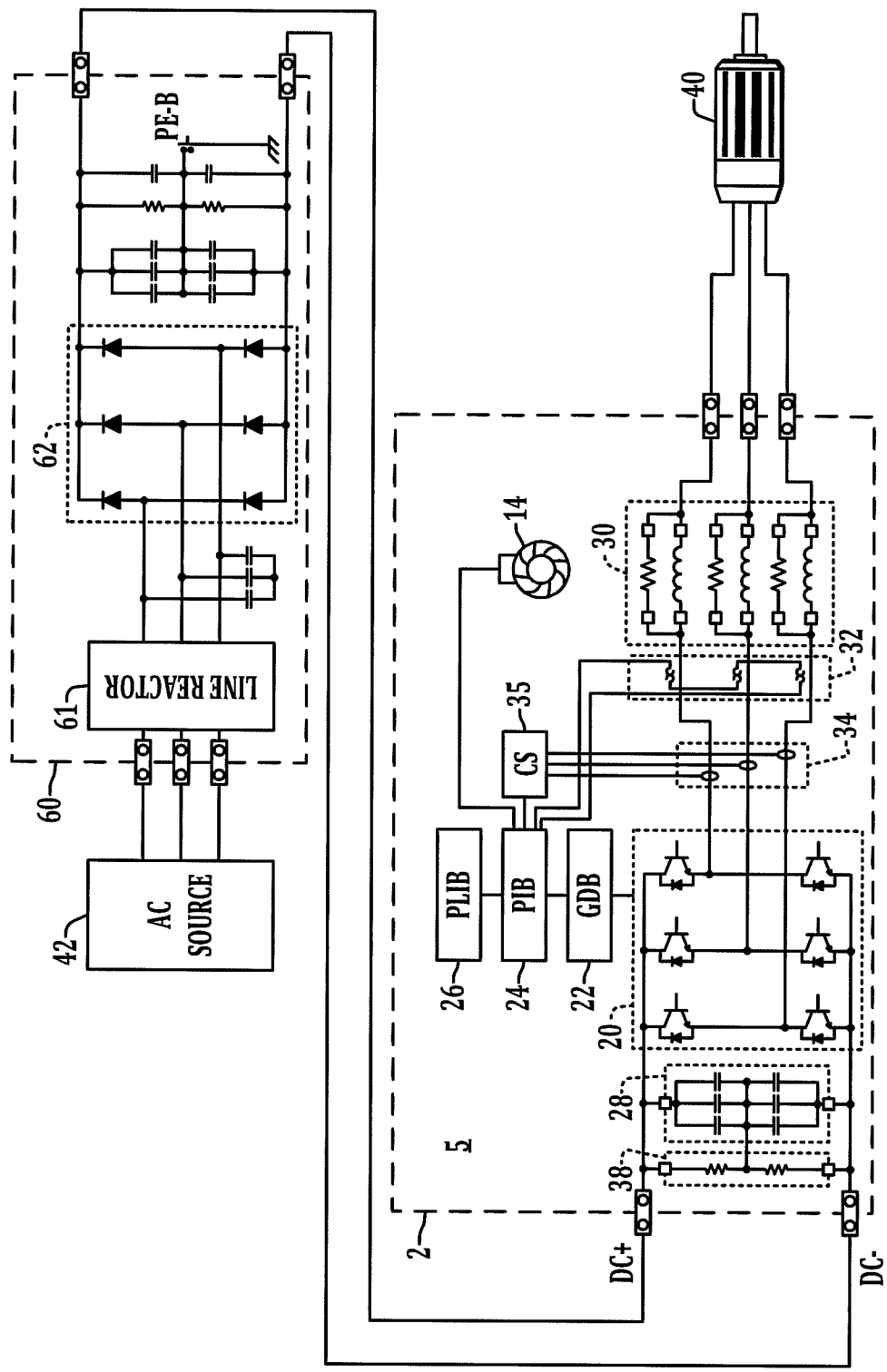
FIG. 8 is a schematic diagram illustrating a non-regenerative voltage source converter type motor drive system including a passive rectifier providing DC input power to a power converter module operating as an inverter with an L-R output filter circuit as shown in FIGS. 1-4.
Figure 9:
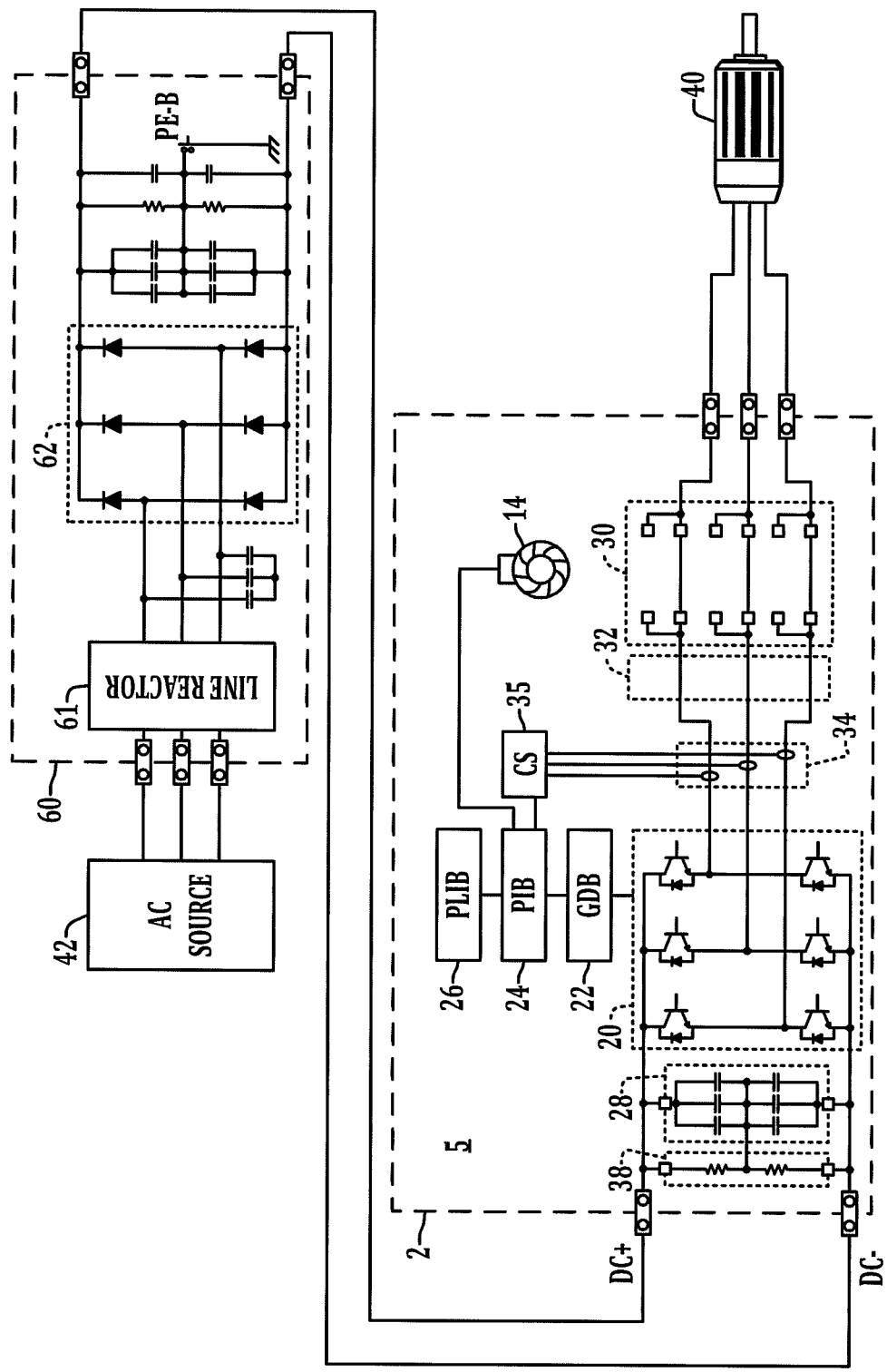
FIG. 9 is a schematic diagram illustrating another non-regenerative motor drive system with a power converter module configured as an inverter with no output filter.

FIGS. 8 and 9 illustrate modular inverter implementations for non-regenerative voltage source converter type motor drive systems. In these systems, a passive or fundamental front end (FFE) rectifier stage 60 is connected to receive AC input power from the source 42, and the illustrated embodiment includes a line reactor 61, a diode circuit 62, a Y-connected input capacitor filter circuit, a DC bus capacitor bank, balancing resistors, and chassis grounding circuitry for connecting a mid-bus voltage to the chassis ground, although any passive rectifier circuit 60 can be used. The resulting DC bus voltage is provided as an input to the DC connections of a power converter module 2, which optionally includes balancing resistors 38 and a DC bus capacitance circuit 28 as previously described. The switching circuit 20 in these examples is operated by pulse width modulated control signals 23 from the gate driver board 22 to invert the DC bus voltage to create AC output power for driving the motor load 40. In the embodiment of FIG. 8, an R-L filter circuit 30 is provided in the converter module 2 including inductors 30L and resistors 30R for protection of the motor load 40. The system of FIG. 9, in contrast, provides direct electrical connections in the filter circuit 30 with the inductors 30L and parallel resistors 30R being omitted with no internal output filtering provided.

FIG. 10 shows an exemplary parallel inverter motor drive system for driving a single motor load 40 via two parallel-connected power converter modules 2 configured to operate as inverters. In this example, the filter circuits 30 of the two power converter modules 2 include filter inductors 30L as well as parallel-connected filter resistors 30R to provide L-R output filters 30 for motor protection. In this case, moreover, the modules 2 each include internal DC bus capacitance circuitry 28 as well as balancing resistors 38, although these can be omitted in alternate implementations. Also, the parallel-connected inverter stages 2 are each connected to a single source of DC input power 50 via a DC precharge module 52 and an external DC capacitance circuit 54, although not a strict requirement of the various aspects of the present disclosure.

Figure 11:
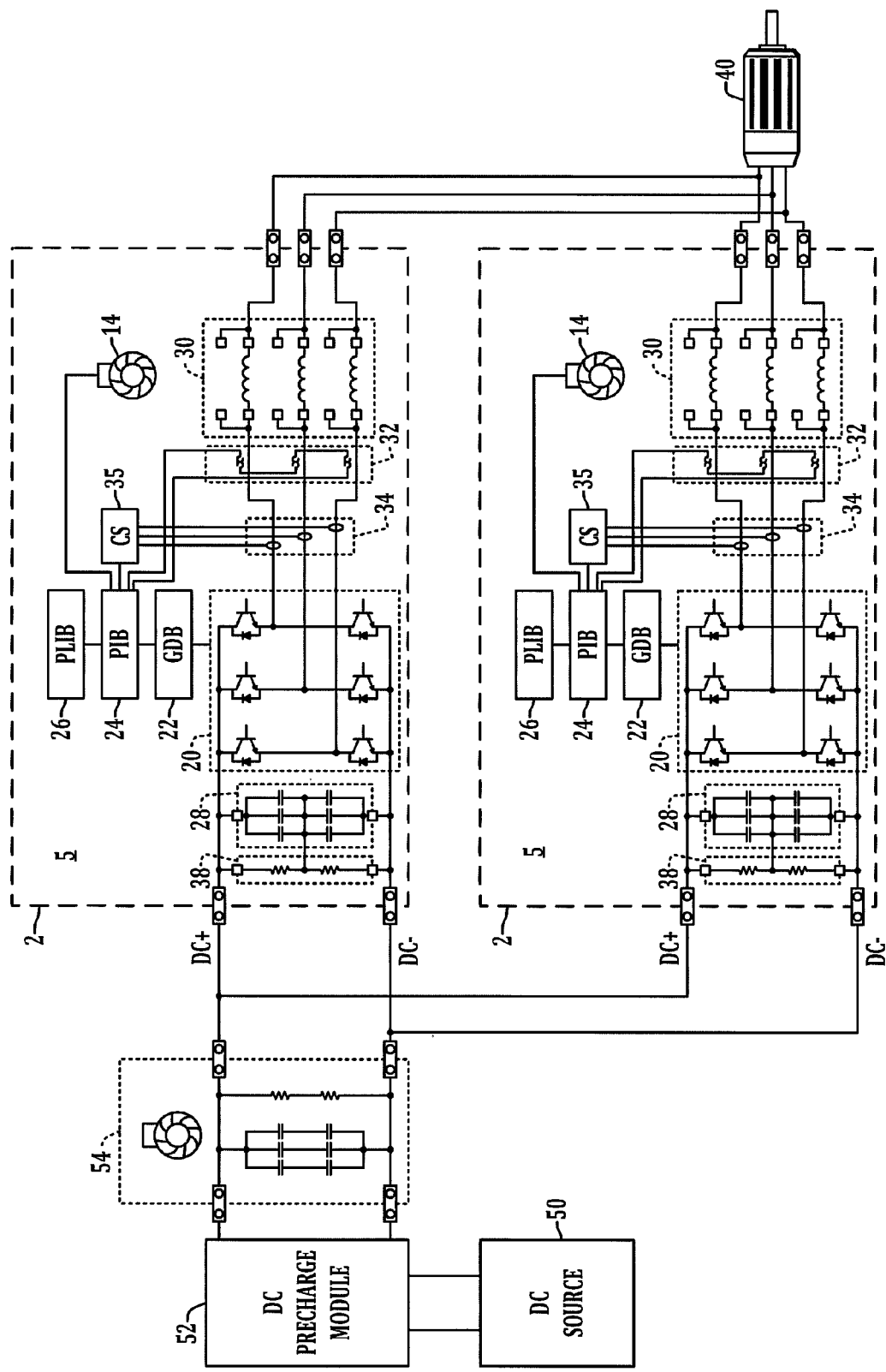
FIG. 11 is a schematic diagram illustrating another parallel system with two power converter modules configured as inverters without output filters to drive a single motor.

FIG. 11 illustrates another parallel inverter system generally as described above in connection with FIG. 10, in which the parallel-connected power converter modules 2 include only filter inductors 30L in the filter circuitry 30. It is noted in FIGS. 10 and 11 that inductors 30L are provided in the filter circuitry 30 in both examples, with the system of FIG. 11 omitting the parallel filter resistors 30R. In various implementations, moreover, different inductances can be provided in these two embodiments as discussed further below in connection with FIGS. 14 and 15.

Figure 12:
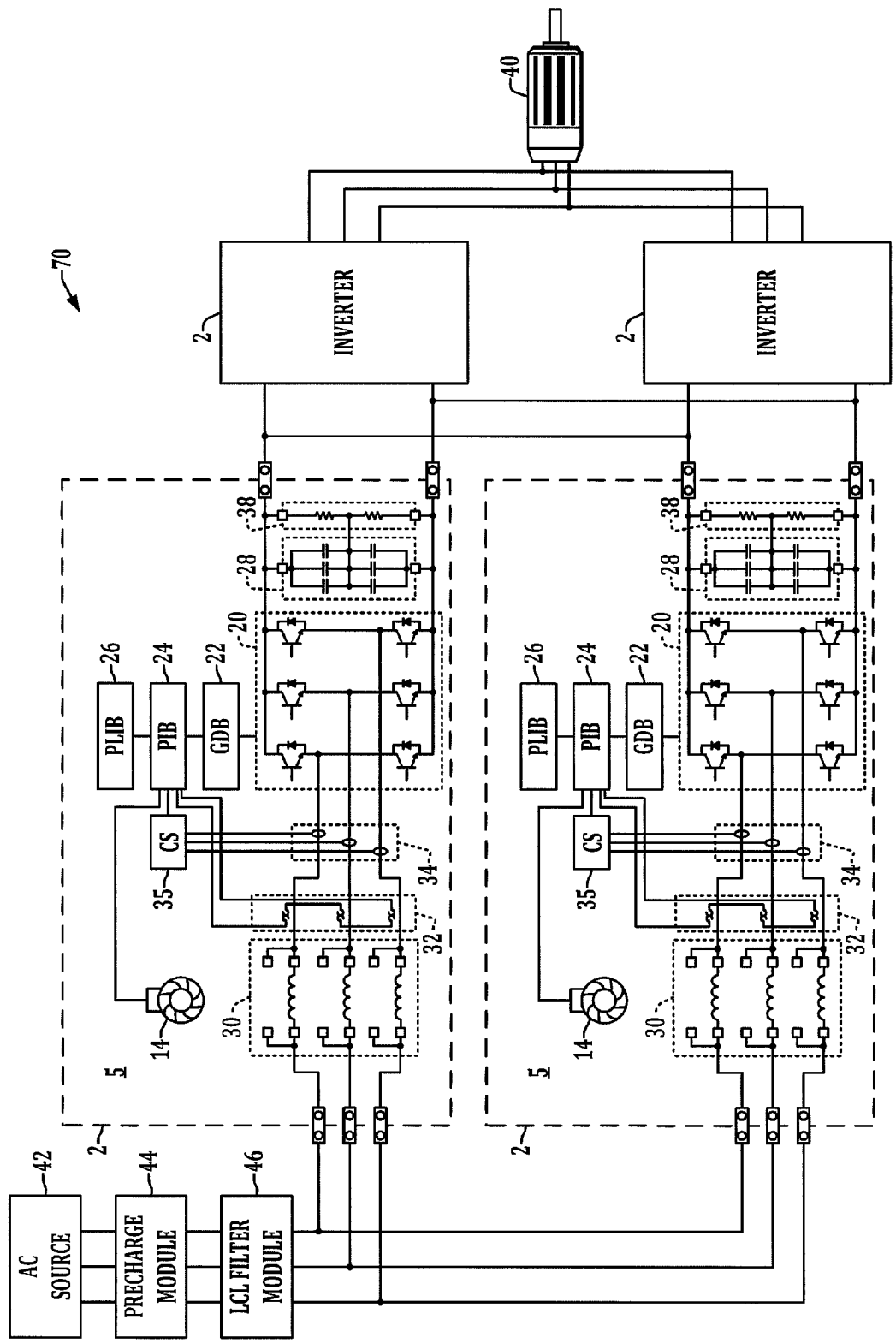
FIG. 12 illustrates another parallel motor drive system with two power converter modules as shown in FIGS. 1-4 configured as active front end (AFE) rectifiers with integral input filter inductors to provide a common DC bus for powering a pair of power converter modules configured as output inverters to drive a single motor load.

FIG. 12 shows a parallel motor drive system 70 in which a single AC power source 42 is used to provide power to a pair of separate (parallel-connected) power converter modules 2 configured as active rectifiers via an optional AC precharge module 44 and an optional LCL filter module 46. In this case, moreover, two separate inverters 2 are provided, which can be implemented using the above-described power converter module 2, but other inverter structures can be used in alternate embodiments. In this case, the DC outputs of the rectifier modules 2 are connected to one another, and the AC inputs to the rectifier modules 2 are also connected to one another. In alternate implementations, the DC outputs of the rectifier modules 2 need not be connected together, but can instead individually drive a corresponding one of the inverters 2. As shown in the embodiment of FIG. 12, moreover, the active front-end rectifier modules 2 include filter circuits 30 having filter inductors 30L, and variant implementations are possible in which parallel-connected filter resistors 30R are provided in the filter circuits 30 of the modules 2.

Figure 13:
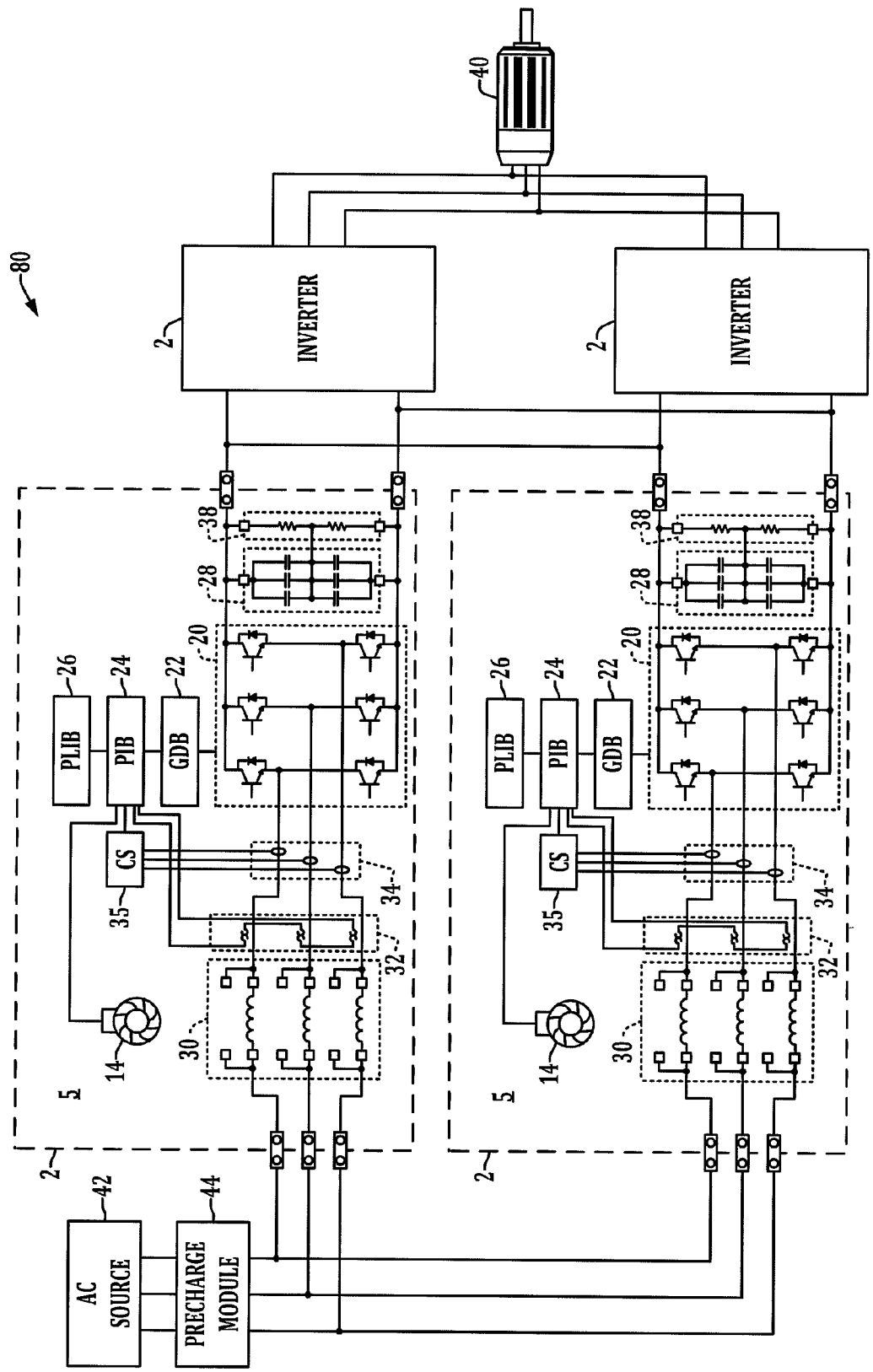
FIG. 13 depicts another parallel system with two power converter modules configured as fundamental front end (FFE) rectifiers with integral paralleling line reactors in the filter circuit, as well as two additional converter modules configured as parallel-connected inverters to drive a motor load.

FIG. 13 shows another parallel motor drive system 80 which also uses parallel-connected rectifier modules 2 with AC inputs and DC outputs coupled together, although the DC outputs need not be connected in all possible embodiments. In addition, like FIG. 12 above, the inverters 2 in the system 80 of FIG. 13 may, but need not be, implemented using the above-described power converter modules 2. The rectifier modules 2 in the system 80, however, are configured to operate as passive or fundamental front-end (FFE) rectifiers for creating and maintaining the DC bus voltage for use by the output inverters 2. In this regard, as seen in FIG. 4 above, the switching circuits 20 of the rectifier modules 2 in FIG. 13 include both switching devices S1-S6 as well as corresponding diodes D1-D6, wherein the gate driver board 22 in such FFE rectifier implementations may be configured to refrain from providing switching control signals to the switches S1-S6, with the passive diodes D1-D6 providing fundamental frequency rectification of the received AC input power. In contrast to the system 70 in FIG. 12, moreover, the LCL filter module 46 is omitted in the system 80 of FIG. 13, and the inductors 30L of the filter circuits 30 in the rectifier modules 2 may be of higher inductance values. In this manner, the fundamental front-end parallel rectifier configuration of FIG. 13 occupies less space than the active front-end system 70 of FIG. 12.

Figure 1:
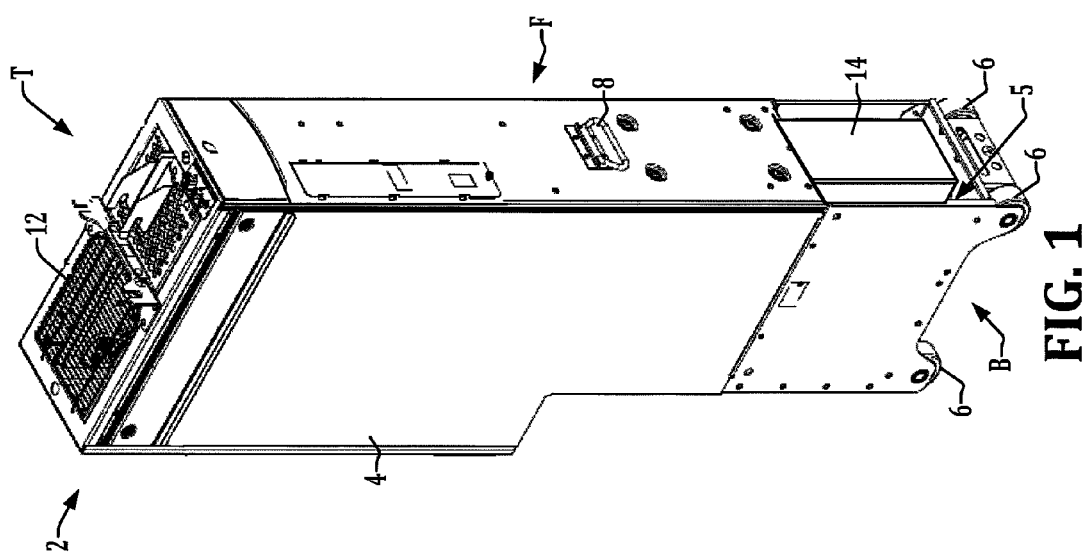
Figure 14:
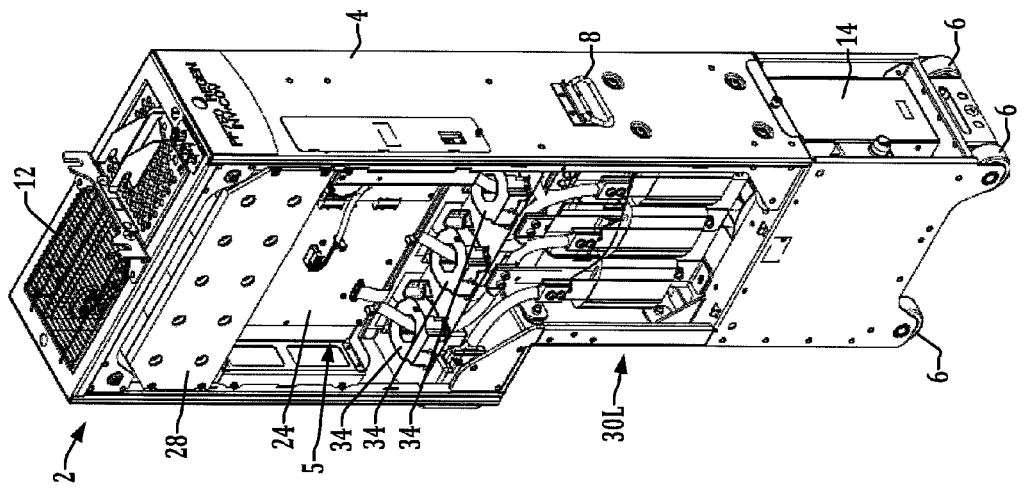
FIG. 14 is a perspective view showing an exemplary power converter module with a side panel removed to illustrate mounting of filter inductors within the enclosure interior.

Referring now to FIGS. 14-23, further details of the illustrated embodiment of the power converter module 2 are illustrated. FIG. 14 shows a perspective view of the module 2 which includes inductors 30L, wherein a modular set of three inductors is further shown in FIG. 15 prior to installation in the enclosure 4. As seen in FIG. 14, the enclosure interior 5 accommodates positioning and mounting of the modular filter inductors 30L toward the lower portion of the enclosure 4, in this case disposed generally directly above the blower fan assembly 14. Moreover, the blower fan assembly 14 and the filter inductors 30L are spaced slightly from the internal sidewall of the enclosure 4 by which an airflow path is provided from the bottom of the enclosure interior 5 past the filter inductors 30L and other components of the module 2 to the vent 12. Also, as seen in FIG. 1 above, thermal sensors 32 can be disposed within the enclosure interior 5, preferably proximate the filter inductors 30L, in order to monitor and assess the thermal condition thereof, with suitable connections to provide signals to the power interface board 24. As further seen in FIG. 14, current sensors or transducers 34 are mounted within the enclosure interior 5, and include sense coils through which cables are passed for sensing of the current flowing between the filter inductors 30L and the switching circuit 20. In addition, FIG. 14 further illustrates the back of the power interface board 24.

Figure 15:
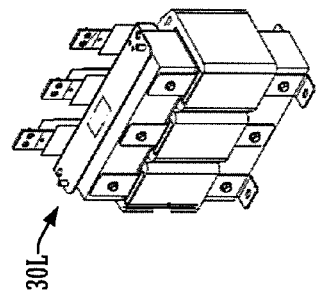
FIG. 15 is a perspective view illustrating an exemplary filter circuit module with three inductors which can be installed in the power converter module of FIG. 14.

As seen in FIGS. 14 and 15, the interior 5 of the enclosure 4 provides mounting surfaces and ample space to accommodate different inductor assemblies 30L, wherein the module 2 can be configured accordingly by installation and connection of any desired internal filter inductors 30L for various applications. For instance, relatively small inductances can be used for parallel rectifier operation (e.g., FIG. 12 above) when external LCL or other filters 46 are employed, and larger inductances can be used by installation of suitable filter inductors 30L in the module 2 to allow or facilitate operation without any external filter circuitry.

Figure 16:
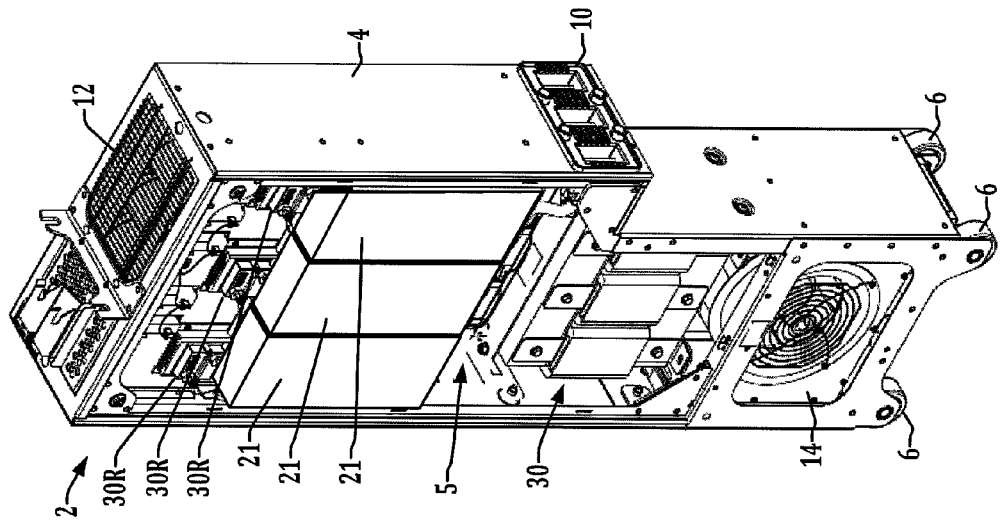
FIG. 16 is a perspective view showing another side of the power converter module with the side panel removed to show positioning of optional filter resistors and IGBT heatsink structures within the enclosure.
Figure 17:
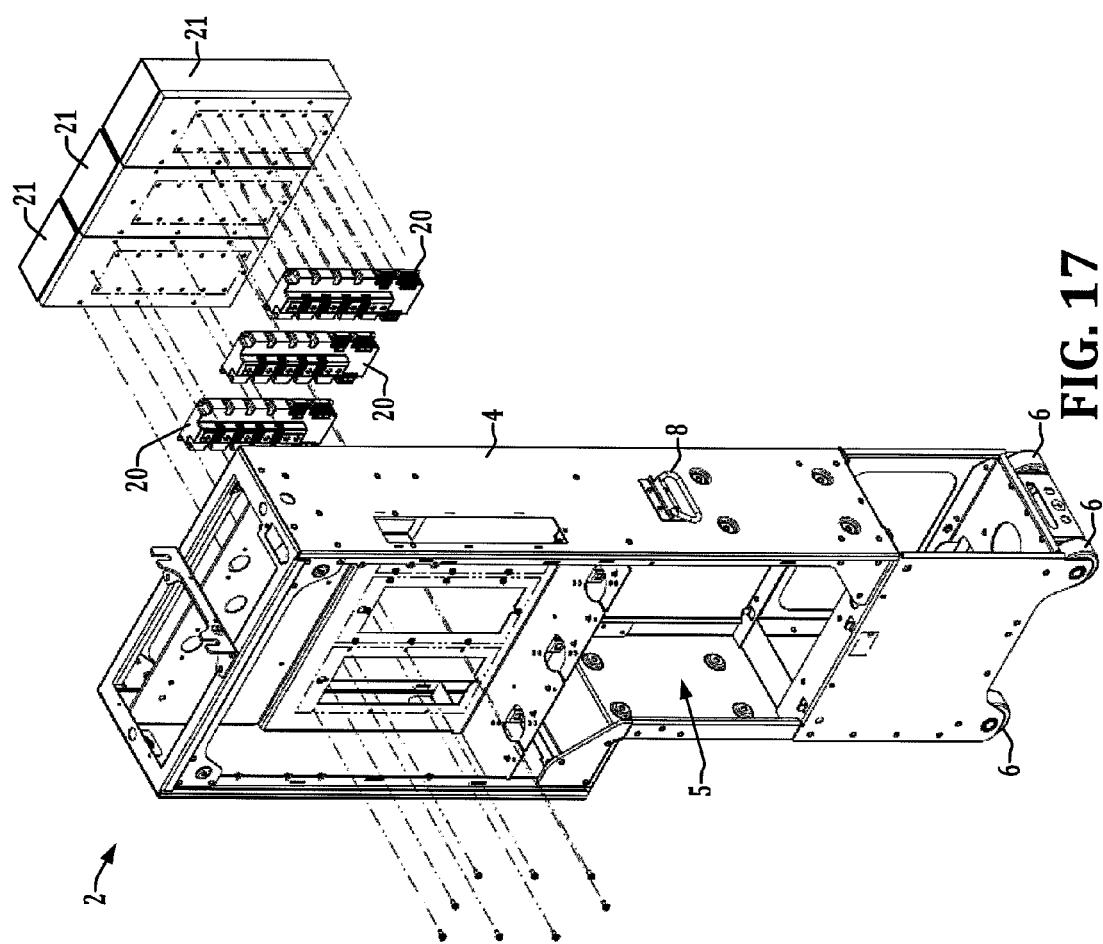
FIG. 17 is a perspective view illustrating installation of IGBT switching devices and corresponding heatsinks in the enclosure interior.

FIG. 16 illustrates the other side of an exemplary power converter module 2 with side panels removed, showing the backside of the installed filter inductors 30L, as well as installed filter resistors 30R. In addition, FIG. 16 illustrates the inlet to the blower fan assembly 14 at the bottom of the module 2, and further shows IGBT heatsink structures 21 and a stab-type connector assembly 10 installed at the back of the module 2. FIG. 17 further illustrates installation of three sets of upper and lower IGBT switching devices 20 into the interior 5 of the enclosure 4, and subsequent mounting of corresponding heatsink structures 21 to the backs of the IGBT modules 20.

Figure 18:
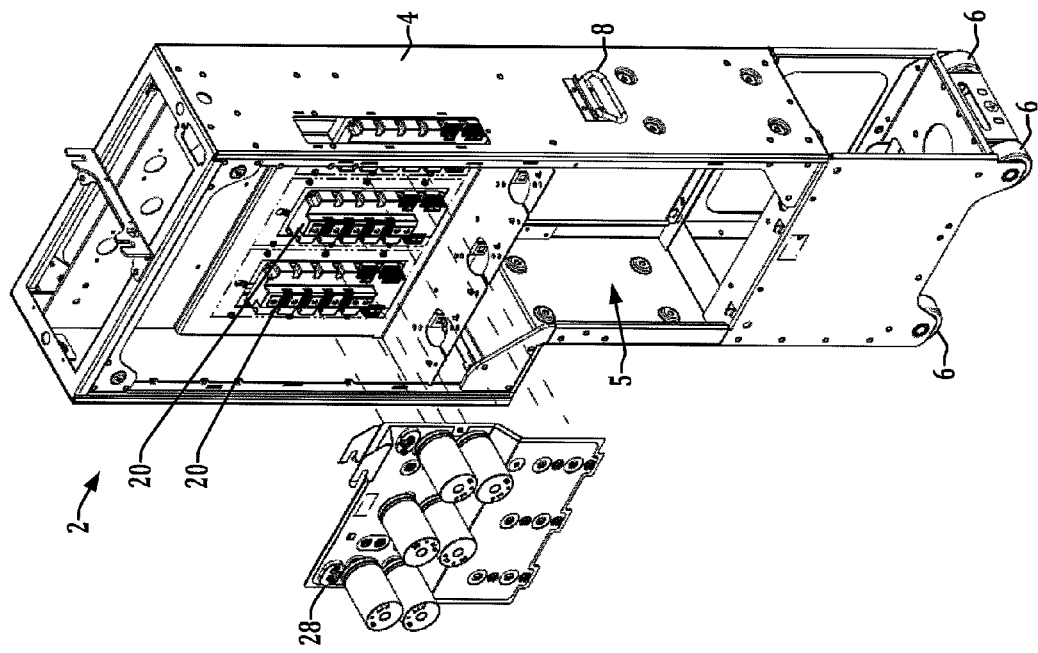
FIG. 18 is a perspective view illustrating installation of an optional DC bus capacitor bank in the interior of the power converter module enclosure.

As seen in FIG. 18, with the IGBTs 20 installed, an exemplary DC bus capacitance circuit module 28 is installed, with corresponding pads being mounted directly to the DC nodes of the switch circuit 20. The circuit 28 in FIG. 18 includes six DC bus capacitors, although other configurations and modular DC bus capacitance circuits 28 can be used, for example, a module 28 including 10 capacitors, whereby different modules 28 can be installed to accommodate different DC bus capacitance requirements for a given application. This, in turn, allows easy configuration of the module 2 to advantageously facilitate elimination of external DC bus capacitance circuitry (e.g., circuit 54 in FIG. 7 above).

Figure 19:
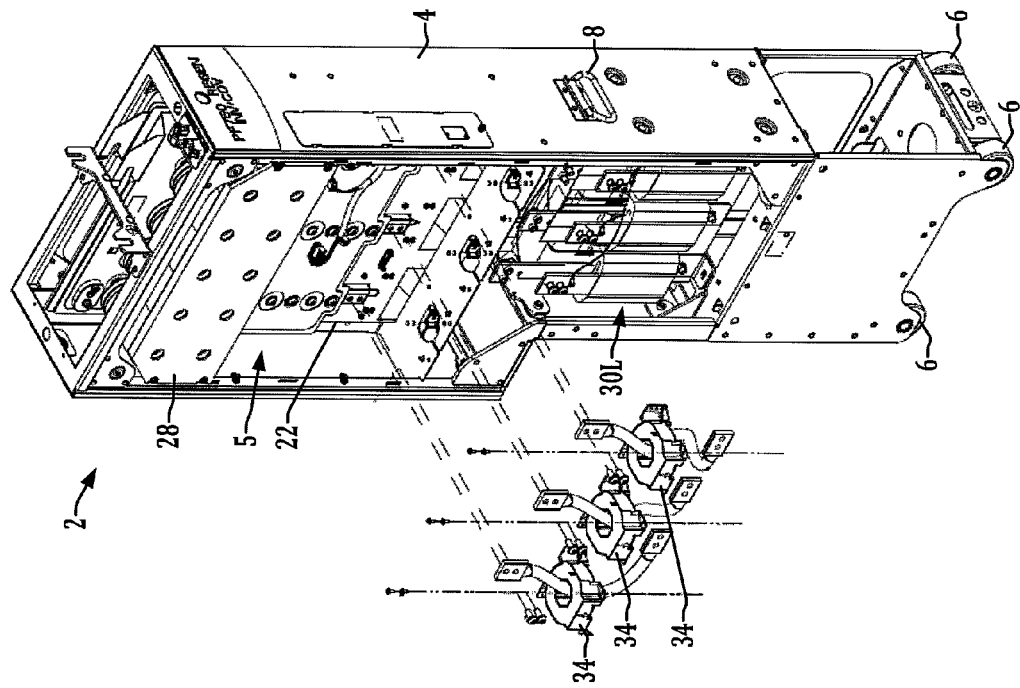
FIG. 19 is a perspective view illustrating a gate driver board, optional filter circuit inductors, and installation of current transducers in the interior of the power converter module enclosure.

FIG. 19 illustrates a gate driver board 22 installed in the enclosure interior 5 for connection to provide the switching control signals 23 to the switching devices S1-S6 of the switching circuit 20, and subsequent installation of the current sensing transducers 34 and associated cabling to connect the filter inductors 30L to the switching circuit 20. FIG. 20 illustrates another possible configuration in which the current transducers 34 are installed with corresponding cables for connection directly to the AC terminals of the stab connector 20 where no filter inductors 30L are included in the module 2.

Figure 22:
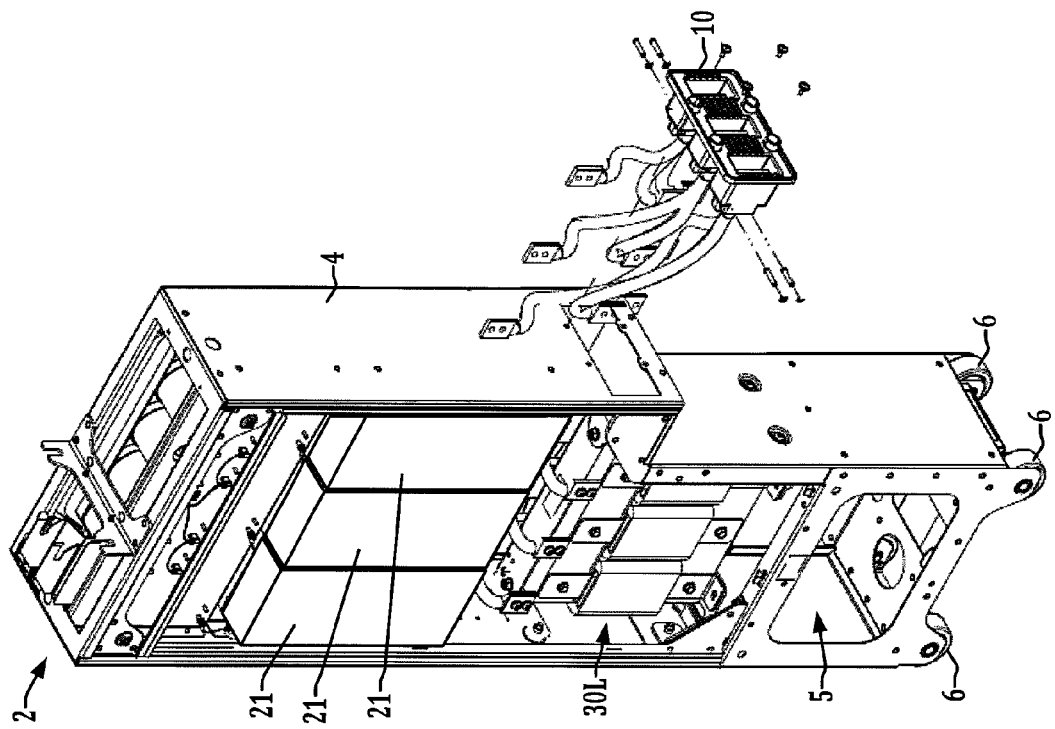
FIG. 22 is a perspective view illustrating installation of a rear-wall power line stab-type connector in the converter module enclosure.

FIG. 21 illustrates subsequent installation of the power interface board 24 and the power layer interface board 26 into the interior 5 of the enclosure 4. FIG. 22 illustrates installation of a rear-wall power line stab connector assembly and corresponding cabling 10 in the converter module enclosure 4, and FIG. 23 shows installation of optional balance resistors 38 (illustrated as two pairs of resistors and associated thermal pads, as well as installation of filter circuit resistors 30R in the interior 5 of the converter module enclosure 4.

The illustrated embodiments thus provide a universal architecture to facilitate cost-effective and space-efficient implementation of a variety of different motor drive and other power conversion systems, wherein the incorporation of integrated magnetics via the filter circuitry 30 and corresponding self-cooling via the blower fan assembly 14 provides a robust modular design 4. The apparatus 2 also provides the capability to easily tailor the filter inductance, DC bus capacitance, balancing resistors, etc. in order to achieve fundamental front end and/or active front end rectification with or without suitable tailored AC input filters 30, or for inverter implementations with configurable output filtering for motor protection. The power conversion apparatus 2 thus provides significant advantages over previous designs and approaches that provided only a limited number of functions without the additional connection of external components. Consequently, the present disclosure provides techniques and apparatus by which the application area can be maximally utilized while controlling cost, without sacrificing the configurability to accommodate a variety of specific motor drive or other power conversion applications.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A power conversion apparatus, comprising:
   an enclosure defining an enclosure interior and having a bottom;
   a plurality of AC electrical connections for connecting external AC power lines to the power conversion apparatus;
   a first and second DC electrical connections for connecting external DC power lines to the power conversion apparatus;
   a switching circuit located in the enclosure interior and including:
      first and second DC nodes individually electrically connected to a corresponding one of the first and second DC electrical connections,
      a plurality of AC nodes individually electrically coupled with a corresponding one of the AC electrical connections, and
      a plurality of switching devices individually operative to selectively couple a corresponding one of the plurality of AC nodes with a corresponding one of the first and second DC nodes according to a corresponding switching control signal; and
   a filter circuit located below the switching circuit in the enclosure interior and including a plurality of inductors individually electrically connected between a corresponding one of the plurality of AC nodes of the switching circuit and a corresponding one of the plurality of AC electrical connections;
   wherein the enclosure includes a top vertically spaced from and above the bottom of the enclosure, wherein the enclosure defines a single airflow path between the top and the bottom, wherein the filter circuit is positioned vertically between the switching circuit and the bottom of the enclosure, and wherein the switching circuit is positioned vertically between the filter circuit and the top of the enclosure.

2. The apparatus of claim 1, wherein the filter circuit includes a plurality of filter resistors individually connected in parallel with a corresponding one of the plurality of inductors.

3. The apparatus of claim 2, comprising a blower fan assembly located in the enclosure interior and operative to cool the filter circuit during operation of the power conversion apparatus.

4. The apparatus of claim 3, comprising a DC bus capacitance circuit located in the enclosure interior and including at least one capacitor connected between the first and second DC electrical connections.

5. The apparatus of claim 4, comprising a DC bus balancing circuit located in the enclosure interior including first and second balancing resistors connected in series with one another between the first and second DC electrical connections.

6. The apparatus of claim 2, comprising at least one control board located in the enclosure interior and operative to provide the switching control signals to operate the switching circuit either as (i) an active rectifier to convert power from an AC source connected to the AC electrical connections to provide DC output power at the first and second DC electrical connections with the filter circuit providing an R-L input filter, or (ii) as an inverter to convert power from a DC source connected to the DC electrical connections to provide AC output power at the plurality of AC electrical connections with the filter circuit providing an R-L output filter.

7. The apparatus of claim 6, comprising a blower fan assembly located in the enclosure interior and operative to cool the filter circuit during operation of the power conversion apparatus.

8. The apparatus of claim 6, comprising a DC bus capacitance circuit located in the enclosure interior and including at least one capacitor connected between the first and second DC electrical connections.

9. The apparatus of claim 1, comprising at least one control board located in the enclosure interior and operative to provide the switching control signals to operate the switching circuit either as (i) an active rectifier to convert power from an AC source connected to the AC electrical connections to provide DC output power at the first and second DC electrical connections with the filter circuit providing an input filter, or (ii) as an inverter to convert power from a DC source connected to the DC electrical connections to provide AC output power at the plurality of AC electrical connections with the filter circuit providing an output filter.

10. The apparatus of claim 1, comprising a blower fan assembly located in the enclosure interior and operative to cool the filter circuit during operation of the power conversion apparatus.

11. The apparatus of claim 10, comprising a DC bus capacitance circuit located in the enclosure interior and including at least one capacitor connected between the first and second DC electrical connections.

12. The apparatus of claim 11, comprising a DC bus balancing circuit located in the enclosure interior including first and second balancing resistors connected in series with one another between the first and second DC electrical connections.

13. The apparatus of claim 10, wherein the blower fan assembly is located below the filter circuit in the enclosure interior.

14. The apparatus of claim 1, comprising a DC bus balancing circuit located in the enclosure interior including first and second balancing resistors connected in series with one another between the first and second DC electrical connections.

15. The apparatus of claim 1, wherein the bottom of the enclosure is supported by a plurality of roller wheels to allow the enclosure to be rolled.

16. The apparatus of claim 1, wherein the filter circuit includes interconnection and mounting features for selective direct connection of the AC electrical connections with the AC nodes of the switching circuit, or for connection of inductors and/or filter resistors between the AC connections and the switching circuit.

17. A power conversion system, comprising:
first and second power converter modules configured as active front-end (AFE) switching rectifiers, each individual power converter module comprising:
an enclosure defining an enclosure interior and having a bottom,
an AC input, including a plurality of AC electrical connections,
a DC output, including a first and second DC electrical connections,
a switching circuit located in the enclosure interior and including:
first and second DC nodes individually electrically connected to a corresponding one of the first and second DC electrical connections,
a plurality of AC nodes individually electrically coupled with a corresponding one of the AC electrical connections, and
a plurality of switching devices individually operative to selectively couple a corresponding one of the plurality of AC nodes with a corresponding one of the first and second DC nodes according to a corresponding switching control signal, and
a filter circuit located below the switching circuit in the enclosure interior and including a plurality of inductors individually electrically connected between a corresponding one of the plurality of AC nodes of the switching circuit and a corresponding one of the plurality of AC electrical connections, and
at least one control board located in the enclosure interior and operative to provide the switching control signals to operate the switching circuit as an active rectifier to convert power from an AC source connected to the AC electrical connections to provide DC output power at the first and second DC electrical connections with the filter circuit providing an input filter;
wherein the AC inputs of the first and second power converter modules are connected to one another to receive AC input power;
wherein the DC outputs of the first and second power converter modules are connected to one another to provide DC output power; and
wherein the enclosure includes a top vertically spaced from and above the bottom of the enclosure, wherein the enclosure defines a single airflow path between the top and the bottom, wherein the filter circuit is positioned vertically between the switching circuit and the bottom of the enclosure, and wherein the switching circuit is positioned vertically between the filter circuit and the top of the enclosure.

18. The power conversion system of claim 17, wherein each individual power converter module comprises a blower fan assembly located in the enclosure interior and operative to cool the filter circuit.

19. A power conversion system, comprising:
first and second power converter modules configured as passive rectifiers, each individual power converter module comprising:
an enclosure defining an enclosure interior and having a bottom,
an AC input, including a plurality of AC electrical connections,
a DC output, including a first and second DC electrical connections, a rectifier circuit located in the enclosure interior and including:
    first and second DC nodes individually electrically connected to a corresponding one of the first and second DC electrical connections,
    a plurality of AC nodes individually electrically coupled with a corresponding one of the AC electrical connections, and
    a plurality of rectifiers individually connected between a corresponding one of the plurality of AC nodes and a corresponding one of the first and second DC nodes,
a filter circuit located below the rectifier circuit in the enclosure interior and including a plurality of inductors individually electrically connected between a corresponding one of the plurality of AC nodes of the rectifier circuit and a corresponding one of the plurality of AC electrical connections, and wherein the AC inputs of the first and second power converter modules are connected to one another to receive AC input power;

wherein the DC outputs of the first and second power converter modules are connected to one another to provide DC output power;

wherein the enclosure includes a top vertically spaced from and above the bottom of the enclosure, wherein the enclosure defines a single airflow path between the top and the bottom, wherein the filter circuit is positioned vertically between the switching circuit and the bottom of the enclosure, and wherein the switching circuit is positioned vertically between the filter circuit and the top of the enclosure.

20. The power conversion system of claim 19, wherein each individual power converter module comprises a blower fan assembly located in the enclosure interior and operative to cool the filter circuit.

\* \* \* \* \*